United States Patent [19]

Taguchi

[11] Patent Number: 4,684,969
[45] Date of Patent: Aug. 4, 1987

[54] HETEROJUNCTION AVALANCHE PHOTODIODE

[75] Inventor: Kenko Taguchi, Tokyo, Japan

[73] Assignee: NEC Corporation, Tokyo, Japan

[21] Appl. No.: 629,292

[22] Filed: Jul. 9, 1984

[30] Foreign Application Priority Data

Jul. 8, 1983 [JP] Japan .................... 58-124478

[51] Int. Cl.$^4$ ............. H01L 27/14; H01L 31/00
[52] U.S. Cl. ..................... 357/30; 357/13; 357/16
[58] Field of Search ................ 357/30, 13, 16

[56] References Cited

FOREIGN PATENT DOCUMENTS 2107927 5/1983 United Kingdom ........... 357/16

OTHER PUBLICATIONS

Capasso et al., "The Superlattice Photodetector: A New Avalanche Photodiode With a Large Ionization Rates Ratio", Dec., 1981, Conference: International Electron Devices Meeting, pp. 284–287.

Forest et al., "An n-$In_{0.53}Ga_{0.47}As$/n-InP Rectifier", J. Appl. Phys., 52(9), Sep. 1981, pp. 5838–5842.

*Primary Examiner*—James W. Davie
*Assistant Examiner*—Georgia Y. Epps
*Attorney, Agent, or Firm*—Sughrue, Mion, Zinn, Macpeak, and Seas

[57] ABSTRACT

An avalanche photodiode comprising an uppermost layer of one conductivity type, a second layer of the other conductivity type wherein the electrons or hole having the greater ionization rate are the minority carriers, a third layer of the second type, having a smaller bandgap than the second layer and wherein the electrons or holes having the greater ionization rate are the majority carriers, and a multi-layer heterojunction structure between the second and third layers comprising alternate layers of the second conductivity type having a bandgap as large as the second layer and layers having a bandgap between those of the second and third layers.

4 Claims, 2 Drawing Figures

HETEROJUNCTION AVALANCHE PHOTODIODE

BACKGROUND OF THE INVENTION

The present invention relates to a light detector, and more particularly to a high-speed, high-sensitivity and low-noise avalanche photodiode (APD) suitable for use in optical communication.

In view of their high-speed and high-sensitivity, photodiodes (PDs) and APDs are particularly important in optical communication systems and, together with semiconductor lasers and light-emitting diodes which constitute light sources, are in process of intensive research and development.

Semiconductor lasers whose oscillation wavelength ranges from 0.7 to 1.8 microns, for instance, those having a structure of GaAlAs-GaAs or InGaAsP-InP, are of primary interest among such lasers.

As light detectors for use with GaAlAs-GaAs semiconductor lasers whose main oscillation wavelength ranges from 0.8 to 0.89 micron, PDs or APDs using crystalline silicon (Si) are extensively used, and they, supported by the advanced techniques achieved in the manufacture of Si ICs and LSIs, manifest excellent performance features, including reliability. However, a Si light detector involves the problem that the absorption coefficient of Si sharply drops at and above the wavelength of 1 micron and, in order to effectively convert light into electric signals in this wavelength region, the depletion layer thickness has to be in the order of tens of micron, which introduces a tremendous difficulty in commercial production. Especially in the wavelength range of 1.1 to 1.8 microns where optical fibers are feasible with little transmission loss, such a light detector would be of no practical use.

Meanwhile, whereas Ge-APDs or Ge-PDs are available as light detectors for use in this wavelength band of 1.1 to 1.5 microns, they have such disadvantages as a large dark current, a comparatively high level of excess noise determined by the quality of Ge, which has little room for improvement, and oversensitivity to ambient temperature variations. Therefore, a need is felt for high-quality APDs and PDs made of III-V semiconductor materials to replace the existing ones in this wavelength region of 1.1 to 1.6 microns.

An example of an APD made of such III-V semiconductor materials has been realized using InP and InGaAs. In this APA, a PN junction is formed in the InP layer and the InGaAs or InGaAsP layer is used for a light absorbing region, thereby achieving a low dark current and high multiplication. (See, for instance, Japanese Patent Publication Nos. Sho 55-132079 and Sho 56-49581.) However, if a high reverse bias is applied in order to effect quick response with this structure, the depletion layer will expand into the light-absorbing InGaAs or InGaAsP layer. As a result, the following problem has been found: The high electric field of the depletion layer expanded in the light-absorbing layer induces avalanche multiplication even in the light-absorbing layer, thereby degrading the excess noise characteristic of the InP-InGaAs of InP-InGaAsP APD structure. This is because while the ionization rate of holes in InP is greater than that of electrons, that of electrons in InGaAs or InGaAsP surpasses that of holes. This would be inconsistent with the basic concept that no low-noise APD can be obtained unless only the carrier whose ionization rate is higher is the main component of multiplication. If, conversely, the field strength in the InGaAs (or InGaAsP) layer is low, holes optically excited by reverse biasing in the InGaAs (InGaAsP) layer will move in the direction of InP having a PN junction, but they will be temporarily stored on the InGaAs-InP heterointerface on account of the valence band discontinuities in the InP-InGaAs (InGaAsP) band structure, and then either be recombined with electrons to disappear or be taken out as a slow-response component to be observed. This can be avoided by increasing the field strength on the InP-InGaAs interface, but then no low-noise APD can be obtained because of the first problem mentioned above. That is to say, the low-noise and quick-response requirements cannot be satisfied simultaneously.

Meanwhile, an attempt was recently proposed to control the ionization rates in an APD so as to make the ionization rate of electrons higher than that of holes by improving the APD structure (See, for example, F. Capasso et al, "Enhancement of Electron Impact Ionization in a Superlattice: A New Avalanche Photodiode with a Large Ionization Rate Ratio", Appl. Phys. Lett. 40(1), 1982, pp. 38–40.). This approach uses a superlattice structure made up of heterojunctions of GaAs and AlGaAs, wherein electrons generated by optical excitation receive small enough energy from an internal electric field created by reverse biasing so as not to induce an avalanche multiplication while travelling through GaAs or GaAlAs. However the generated electrons receive a quantity of energy corresponding to the discontinuities of conduction bands, attributable to the GaAlAs-GaAs heterojunction, and thereby achieve ionization. This is a remarkable new approach.

SUMMARY OF THE INVENTION

An object of the present invention, therefore, is to provide a low-noise and high-speed APD in which an absorbing layer has a high electric field, as exemplified by the aforementioned APD using III-V or II-VI semiconductor materials.

An APD according to the invention comprises a first semiconductor layer of a first conductivity type wherein electrons or holes, whichever have the greater ionization rate, constitute the minority carrier, and a second semiconductor layer of the first conductivity type, having a smaller bandgap than the second, wherein electrons or holes, whichever have the greater ionization rate, constitute the majority carrier. A semiconductor region of a second conductivity type is fabricated in the first semiconductor layer to provide a PN junction. The APD further involves a multi-heterojunction structure positioned between the first and second semiconductor layers and comprising, alternately laid one over the other, third semicoductor layers of the first conductivity type and having a bandgap not smaller than that of the second, and fourth semiconductor layers having a bandgap not smaller than that of the second semiconductor layer but not larger than that of the first semiconductor layer. This heterojunction structure either substantially equalizes the ionization rates of electrons and holes optically excited in said second or third semiconductor layers or makes whichever have a greater ionization rate the minority carrier in said first semiconductor layer, and produces further multiplication in the first semiconductor layer.

The present invention differs from the APD of F. Capasso et al, whose basic concept is to induce selective ionization by utilizing only the discontinuities of the bandgaps of heterojunction, in that it uses in combination the ionization in crystals and the ionization derived from the discontinuities of the bandgaps of multi-heterojunctions.

DETAILED DESCRIPTION OF THE PREFERRED EMBODIMENT

Figure 1:
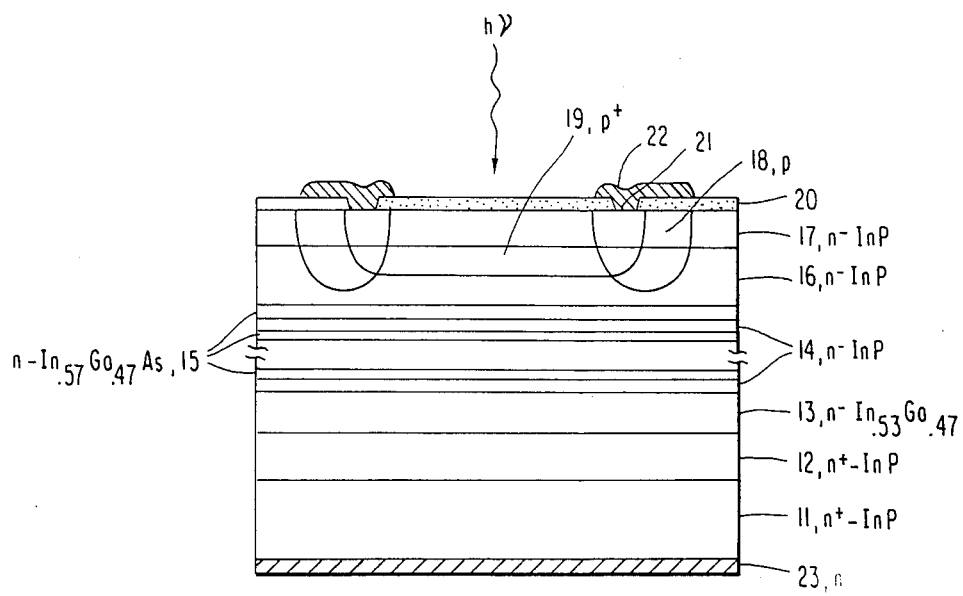
FIG. 1 shows a cross-sectional view of one preferred embodiment of the invention.

One preferred embodiment of the present invention has a structure whose cross section is illustrated in FIG. 1. This APD is produced in the following process. After forming an n+-InP layer 12 of about 3 microns by an epitaxial growth method (for example, the gas-phase epitaxial growth method) over an n+ type InP substrate 11 having a (100) face, an n type $In_{0.53}Ga_{0.47}As$ layer 13 of 2 microns in film thickness and $5 \times 10^{15}$ $cm^{-3}$ in impurity concentration is formed. Next, after alternately forming ten each of n type InP layers 14 of 600 Å in film thickness and $5 \times 10^{15}$ $cm^{-3}$ in impurity concentration and n type $In_{0.57}Ga_{0.47}As$ layers 15 of 400 Å in film thickness and $5 \times 10^{15}$ $cm^{-3}$ in impurity concentration, an n-type InP layer 16 of 3 microns in film thickness and $8 \times 10^{15}$ $cm^{-3}$ in impurity concentration is formed, and finally an n type InP layer 17 of 2 microns in film thickness and $3 \times 10^{15}$ $cm^{-3}$ in impurity concentration is formed. Here, the first semiconductor layer are the $In_{0.53}Ga_{0.47}As$ layer 13; the second semiconductor layer is the InP layer 16; the third semiconductor layer is the InP layers 14; and the fourth semiconductor layers are the $In_{0.53}Ga_{0.47}As$ layers 15.

After forming a $SiO_2$ or $Si_3N_4$ film by the gas-phase growth method or the sputter method over the surface of the wafer produced in this manner, the $SiO_2$ or $Si_3N_4$ film is selectively removed in a ring form by photoresist and aligning steps. Next, the wafer is subjected to selective zinc diffusion by placing it in a exhausted tube with metallic zinc used as the source of diffusion and thermally treating it at about 350° C., and a ring-shaped zinc diffusion area 18 is thereby obtained. The thermal diffusion and treatment here is continued for 100 hours to form the p-type impurity region 18, in which zinc is diffused, in the InP layer 16.

Next, after forming again a $SiO_2$ or $Si_3N_4$ film similar to what was referred to above, the part of the $SiO_2$ or $Si_3N_4$ film within the ring-shaped periphery of the zinc diffusion area 18 is selectively removed. This wafer is then subjected to selective cadmium diffusion by placing it in a exhausted tube with $Cd_3P_2$ being used as the source of diffusion, and thermally treated at a high temperature of 570° C. to obtain a p+ InP region 19 in which cadmium is diffused. Further, after forming again a $SiO_2$ or $Si_3N_4$ film 20 and forming a ring-shaped electrode take-out window 21 by photoresist and aligning techniques, a p-type electrode 22 is so formed, as illustrated, as to cover the window 21 and to exclude a light inlet window. Finally, an n-type electrode 23 is formed beneath the InP substrate 11 to obtain a light detector according to the present invention.

As the PN junction obtained by the thermal diffusion of cadmium in this light detector is about 3.5 microns, a detector of this kind having a diffusion diameter of about 100 microns can be expected to manifest a very steep breakdown characteristic, the breakdown voltage being around 120 V at a dark current of 10 nA or below. Its excess noise at a multiplication rate of 10 was about 7 dB, and avalanche multiplication over 100 and optical response rate of 1 GHz or above can further be expected.

Figure 2:
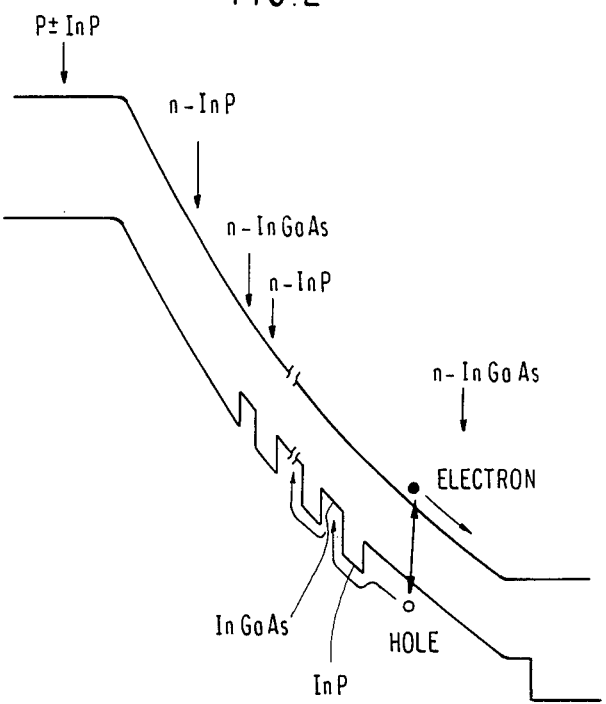
FIG. 2 illustrates a simplified model of the band energy under reverse biasing in this embodiment.

These excellent performance features can be explained by the fact that the ionization rate of holes, out of the optically excited electron-hole pairs, rises in the course of passing the multi-heterojunctions of InP and InGaAs, Referring now to FIG. 2, the energy band of the embodiment illustrated in FIG. 1 is roughly illustrated in terms of a reverse-biased state. Holes optically excited in InGaAs pass an InGaAs-InP hetero-interface under a high electric field, reach an InP layer and then, in the course of passing an InP-InGaAs interface, receive an energy differential attributable to the discontinuities of the InGaAs and InP valence bands, resulting in an increased probability for the holes to ionize in InGaAs. Here, in contrast to conventional InP-InGaAs APDs wherein noise suppression is hindered by the predominance of ionization by electrons in the high electric field InGaAs layers, besides the multiplication effect in the InP layers, the InP-InGaAs multi-layer structure serves to suppress noise by increasing the ionization probability of holes as they pass the InGaAs layers, so that a low-noise APD can be realized without sacrificing high-speed response feature.

Though in the foregoing embodiment InP and InGaAs are used for multi-heterojunctions, other semiconductor compounds can as well be used. The multi-heterojunctions may be composed of InP and InGaAsP layers, or InGaAs and AlInAs layers. Further, where the light-abosrbing layer is to be made of GaSb, the multi-heterojunctions can also consist of GaAlSb(As) and GaSb.

What is claimed is:

1. An avalanche photodiode comprising:
a substrate of a first conductivity type;
a first semiconductor layer of a first conductivity type having a greater ionization rate for minority carriers than for majority carriers, said first semiconductor layer being formed over said substrate;
a second semiconductor layer of said first conductivity type, having a smaller bandgap than said first layer to provide an absorption region;
a multi-heterojunction structure positioned between said first and second semiconductor layers and comprising, alternately laid one over the other, semiconductor layers of said first conductivity type and having a bandgap not smaller than that of said first semiconductor layer, and fourth semiconductor layers having a bandgap not smaller than that of said second semiconductor layer but not larger than that of said first semiconductor layer, said multi-heterojunction structure enhancing an ionization rate of minority carriers greater than that of said majority carriers due to a band edge discontinuity;
a semiconductor region of a second conductivity type formed within said first semiconductor layer to provide a PN junction separated from the multi-heterojunction structure; and
a pair of electrodes disposed over said substrate and said semiconductor layer of the second conductivity type, for biasing said PN junction.

2. An avalanche photodiode, as recited in claim 1;

wherein said first conductivity type is n-type;
wherein said first and third semiconductor layers are composed of InP;
wherein said second semiconductor layer is composed of InGaAs; and
wherein said fourth semiconductor layer is composed of InGaAs.

3. An avalanche photodiode, as recited in claim 1, further comprising a contact electrode layer of the second conductivity type for contacting the second semiconductor layer.

4. An avalanche photodiode comprising:
a substrate of a first conductivity type;
a first semiconductor layer of n-type conductivity and having a greater ionization rate for holes than for electrons to provide an avalanche region, said first semiconductor layer being formed over said substrate;
a second semiconductor layer of said n-type conductivity, having a smaller bandgap than said first layer and having a greaer ionization rate for electrons than for holes to provide an absorption region;
a multi-heterojunction structure positioned between said first and second semiconductor layers and comprising, alternately laid one over the other, third semiconductor layers of said n-type conductivity and having a bandgap not smaller than that of said first semiconductor layer, and fourth semiconductor layers of said n-type conductivity and having a bandgap not smaller than that of said second semiconductor layer but not larger than that of said first semiconductor layer, said multi-heterojunction structure enhancing an ionization rate for holes greater than that for electrons due to the valence band edge discontinuity;
a semiconductor region of a p-type conductivity formed within said first semiconductor layer to provide a PN junction separated from the multi-heterojunction structure; and
a pair of electrodes, disposed over said substrate and said semiconductor layer of the second conductivity type, for biasing said PN junction.

* * * * *

UNITED STATES PATENT AND TRADEMARK OFFICE
CERTIFICATE OF CORRECTION

PATENT NO. : 4,684,969
DATED : August 4, 1987
INVENTOR(S) : Kenko Taguchi

It is certified that error appears in the above-identified patent and that said Letters Patent is hereby corrected as shown below:

COLUMN 1, LINE 49 After "this" delete "APA" insert --APD--
COLUMN 1, LINE 62 After "InP-InGaAs" delete "of" insert --or--
COLUMN 3, LINE 46 After "for" insert --about--
COLUMN 4, LINE 35 After "light" delete "abosrbing" insert --absorbing--

Signed and Sealed this

Second Day of August, 1988

Attest:

DONALD J. QUIGG

*Attesting Officer*     *Commissioner of Patents and Trademarks*